(12) United States Patent
Henstra et al.

(10) Patent No.: US 11,915,904 B2
(45) Date of Patent: Feb. 27, 2024

(54) REDUCTION OF THERMAL MAGNETIC FIELD NOISE IN TEM CORRECTOR SYSTEMS

(71) Applicant: FEI Company, Hillsboro, OR (US)

(72) Inventors: Alexander Henstra, Eindhoven (NL); Pleun Dona, Eindhoven (NL)

(73) Assignee: FEI COMPANY, Hillsboro, OR (US)

( * ) Notice: Subject to any disclaimer, the term of this patent is extended or adjusted under 35 U.S.C. 154(b) by 0 days.

(21) Appl. No.: 17/880,624

(22) Filed: Aug. 3, 2022

(65) Prior Publication Data

US 2022/0392736 A1    Dec. 8, 2022

Related U.S. Application Data (63) Continuation of application No. 17/139,859, filed on Dec. 31, 2020, now Pat. No. 11,437,216.

(51) Int. Cl.
   *H01J 37/153*    (2006.01)
   *H01J 37/28*    (2006.01)

(52) U.S. Cl.
   CPC ............ *H01J 37/153* (2013.01); *H01J 37/28* (2013.01); *H01J 2237/1516* (2013.01); *H01J 2237/1534* (2013.01)

(58) Field of Classification Search
   CPC .......... H01J 37/00; H01J 37/02; H01J 37/153; H01J 37/28; H01J 37/147; H01J 37/145; H01J 37/1477; H01J 37/26; H01J 37/026; H01J 37/261; H01J 37/304; H01J 37/08; H01J 37/244; H01J 2237/1516; H01J 2237/1534; H01J 2237/04924; H01J 2237/04926

USPC .......................................... 250/306, 307, 311
   See application file for complete search history.

(56) References Cited

U.S. PATENT DOCUMENTS 6,586,746 B1 *    7/2003    Messick ................ H01J 37/147
   250/398
   2007/0228285 A1 *    10/2007    Fuse ................ H01L 21/67213
   29/825
   2010/0084567 A1 *    4/2010    Sawada ................ H01J 37/145
   250/396 ML

(Continued)

*Primary Examiner* — Jason L McCormack
(74) *Attorney, Agent, or Firm* — Kilpatrick Townsend & Stockton, LLP (57) ABSTRACT

Systems for reducing the generation of thermal magnetic field noise in optical elements of microscope systems, are disclosed. Example microscopy optical elements having reduced Johnson noise generation according to the present disclosure comprises an inner core composed of an electrically isolating material, and an outer coating composed of an electrically conductive material. The product of the thickness of the outer coating and the electrical conductivity is less than $0.01\Omega^{-1}$. The outer coating causes a reduction in Johnson noise generated by the optical element of greater than 2x, 3x, or an order of magnitude or greater. In a specific example embodiment, the optical element is a corrector system having reduced Johnson noise generation. Such a corrector system comprises an outer magnetic multipole, and an inner electrostatic multipole. The inner electrostatic multipole comprises an inner core composed of an electrically isolating material and an outer coating composed of an electrically conductive material.

20 Claims, 4 Drawing Sheets

(56) References Cited

U.S. PATENT DOCUMENTS

2018/0166248 A1* 6/2018 Ogasawara ......... H01J 37/3177

* cited by examiner

REDUCTION OF THERMAL MAGNETIC FIELD NOISE IN TEM CORRECTOR SYSTEMS

CROSS-REFERENCE TO RELATED APPLICATIONS

This application is a Continuation under 35 U.S.C. § 120 of pending U.S. application Ser. No. 17/139,859 filed Dec. 31, 2020. The entire contents of the aforementioned application are incorporated by reference herein.

BACKGROUND OF THE INVENTION

Thermal magnetic field noise (Johnson noise) from magnetic and non-magnetic conductive parts close to the electron beam recently has been identified as a reason for decoherence in electron microscopy systems. Thermal magnetic field noise originates from thermally driven currents in the conductive magnetic as well as non-magnetic materials close to the imaging beam, such as yokes, lenses, and multipoles. This is especially an issue in chromatic aberration correctors ($C_C$) (corrector systems designed to correct for the axial chromatic aberration coefficient) and $C_C/C_S$ correctors (which correct for $C_C$ and for the spherical aberration coefficient) which remove primary resolution limiting factors, causing thermal magnetic field noise to be a limiting aberration in high-resolution TEM systems. For example, in a quadrupole-octupole $C_C/C_S$ corrector, the main contribution to thermal magnetic field noise comes from the two $C_C$ correcting elements (i.e., quadrupole Wien filters). Thus, while current TEM $C_C/C_S$ correctors are able to compensate for spherical and chromatic aberrations, they also generate thermal magnetic field noise that at least partially causes a severe dampening of spatial frequencies larger than ~1 $\text{Å}^{-1}$. This problem worsens for large gap objective lenses for which the blur caused by thermal magnetic field noise increases with the square root of the lens gap.

As thermal magnetic field noise scales with the square root of temperature, cooling solutions have been suggested to compensate for this thermal magnetic field noise. For example, to address thermal magnetic field noise cooling systems using various techniques/elements such as liquid nitrogen, heat pipes, and/or cooling rods have been devised. However, the cooling of a $C_C/C_S$ corrector is both challenging to design and expensive to implement, making it not a practical solution outside of cryogenic systems. Accordingly, a less expensive and easier to implement solution to correct for thermal magnetic field noise in imaging systems is desired.

SUMMARY

Systems for reducing the generation of thermal magnetic field noise in optical elements of microscope systems, are disclosed. An example microscopy optical element having reduced Johnson noise generation according to the present disclosure comprises an inner core composed of an electrically isolating material, and an outer coating composed of an electrically conductive material. The product of the thickness of the outer coating (t) and the electrical conductivity ($\sigma$) is less than 0.01 $\Omega^{-1}$, 0.001 $\Omega^{-1}$, 0.0001 $\Omega^{-1}$. The outer coating according to the present invention causes a reduction of 2×, 3×, an order of magnitude, or greater in the Johnson noise generated by the optical element. In a specific example embodiment, the optical element is a corrector system having reduced Johnson noise generation. Such a corrector system comprises $C_C$ correcting elements which consist of an outer magnetic multipole, and an inner electrostatic multipole. The inner electrostatic multipole comprises an inner core composed of an electrically isolating material and an outer coating composed of an electrically conductive material.

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicates similar or identical items.

DETAILED DESCRIPTION OF EMBODIMENTS

Methods and systems for reducing thermal magnetic noise in microscope imaging systems, are disclosed. Specifically, the methods and systems involve an optical component that comprises an inner core composed of an electrically isolating material and an outer coating made of an electrically conductive material that encloses the inner core. In some embodiments of the disclosed invention, the optical component is an electrostatic multipole of a corrector (e.g., a $C_C/C_S$ corrector) comprising one or more inner electrostatic multipoles and one or more outer magnetic multipoles. In some example embodiments, the presence of this electrically conductive material layer enclosing the inner electrically isolating core reduces the generation of thermal magnetic field noise by the corrector by 2×, 3×, an order of magnitude, or more.

Figure 1:
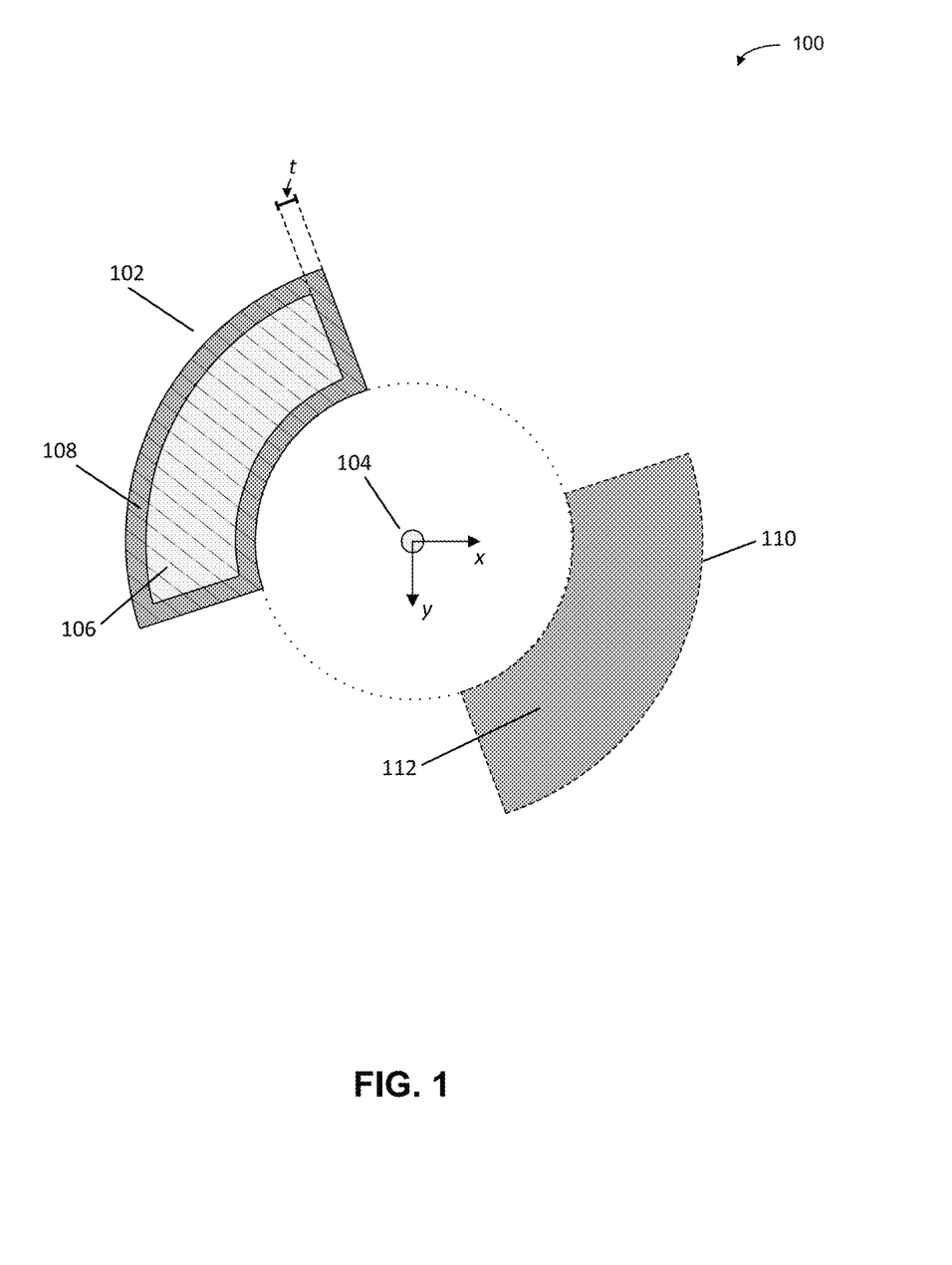
FIG. 1 schematically illustrates an optical component configured to reduce thermal magnetic noise in microscope imaging systems, according to the present invention.

FIG. 1 is a schematic illustration of an optical component 100 configured to reduce thermal magnetic noise in microscope imaging systems, according to the present invention. Specifically, FIG. 1 shows a cross section of an optical component 102 proximate to a charged particle beam path 104. FIG. 1 illustrates the charged particle beam path 104 as traveling along a z-axis, and the cross section of the optical component 102 as being bisected by an xy-plane. The optical component 102 comprises an inner core 106 composed of an electrically isolating material. In various embodiments, the inner core 106 may be composed of various electrically resistant materials such as a ceramic material, a vitreous material, quartz, a semiconductor material, etc. A person having skill in the art would understand that this list of potential electrically resistant materials is not exhaustive, and that various electrically isolating materials (and/or combinations thereof) may be selected according to the function of the optical element or the system in which it resides.

FIG. 1 further shows the optical element 102 as comprising an outer coating 108 composed of an electrically conductive material that completely encloses the inner core. However, in other embodiments the outer coating may not completely encloses the inner core. The electrically conductive material is selected such that the product of the thickness of the outer coating (t) and the electrical conductivity ($\sigma$) of the electrically conductive material is less than 0.01 $\Omega^{-1}$, 0.001 $\Omega^{-1}$, and/or 0.0001 $\Omega^{-1}$. In various embodiments, the outer coating 108 can be electrically grounded and/or a voltage applied to the outer coating 108. Moreover, in different embodiments the outer coating 108 may have a sheet resistance (i.e., $1/(\sigma \times t)$) that is greater than 10 k$\Omega$, and/or greater than 100 k$\Omega$. The presence of this outer coating 108 on the optical element 102 causes the amount of thermal magnetic field noise (i.e., Johnson noise) that is generated by the optical element 102 to be reduced by at least 2×, 3×, or an order of magnitude over known optical elements.

In various embodiments of the present invention, the optical element 102 may correspond to various optical microscope elements, or component elements thereof. For example, the optical element 102 may correspond to an electrode, a multipole element, a deflector, or a component element of a corrector, such as a Cc and/or Cs corrector.

FIG. 1 also illustrates the optical component 100 as including an optional second optical element 110 comprising an inner core 106 composed of an electrically isolating material that is enclosed by an outer coating 112 composed of an electrically conductive material. An example embodiment having two such optical elements may be a beam deflector system. According to the present invention, such a beam deflector system would be able to cause deflections of the charged particle beam 104 while generating a greatly reduced amount of thermal magnetic noise when the charged particle beam 104 passes proximate to the optical elements 102 and 110.

Figure 2:
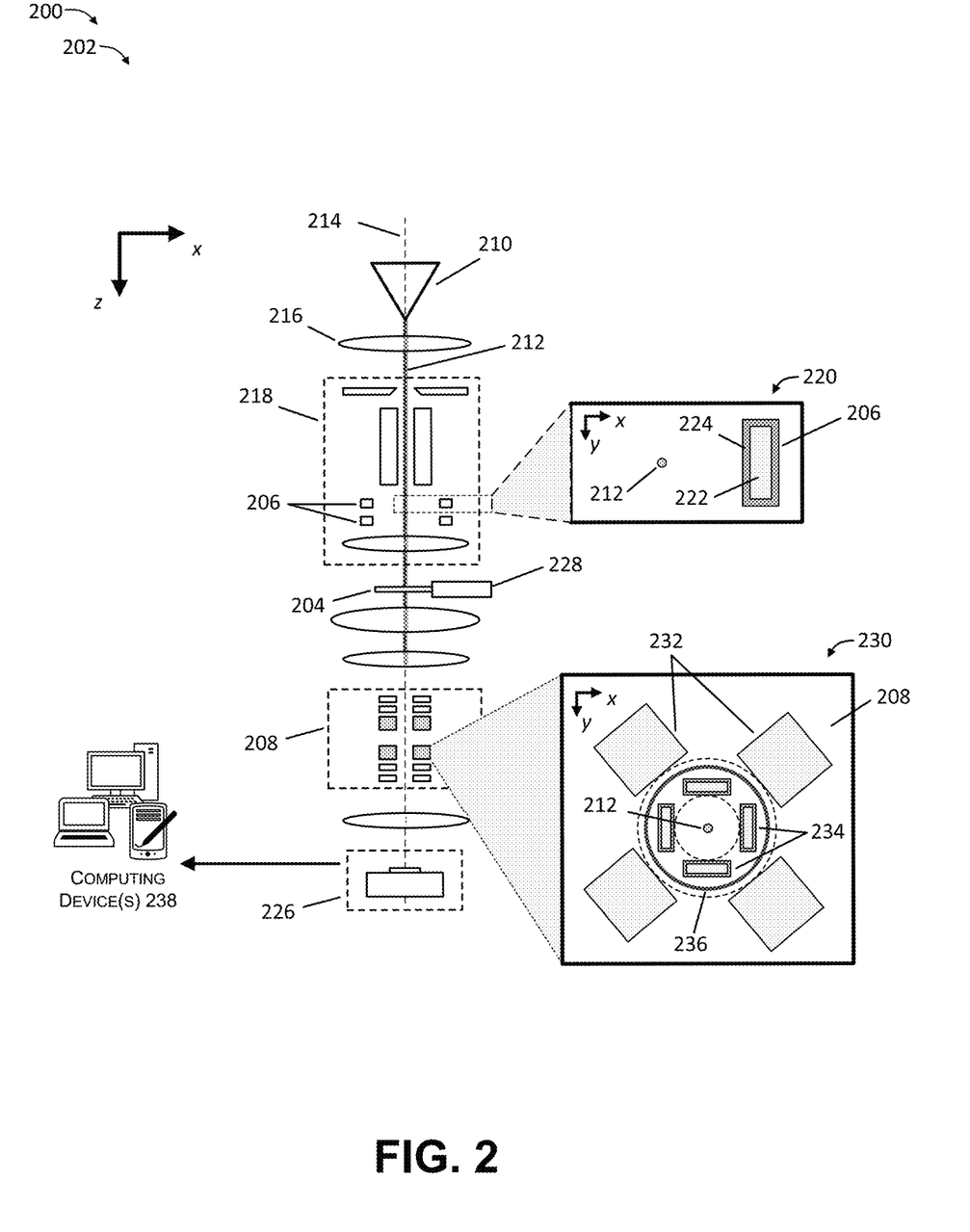
FIG. 2 depicts an environment of a microscope imaging system including one or more optical components configured to reduce thermal magnetic noise during processing, imaging, and/or evaluation of samples.

FIG. 2 is an illustration of an environment 200 of a microscope imaging system including one or more optical components configured to reduce thermal magnetic noise during processing, imaging, and/or evaluation of samples. Specifically, FIG. 2 shows an example environment 200 that includes an example microscope system(s) 202 for investigating of a sample 204 that includes both a deflector system 206 and a corrector system 208 that are each configured according to the present invention to reduce the amount of thermal magnetic field noise they generate. Specifically, FIG. 2 shows the example microscope system(s) 202 as including a $C_S/C_C$ corrector system 208.

The example microscope system(s) 202 may be or include one or more different types of optical, and/or charged particle microscopes, such as, but not limited to, a scanning electron microscope (SEM), a scanning transmission electron microscope (STEM), a transmission electron microscope (TEM), a charged particle microscope (CPM), a cryo-compatible microscope, focused ion beam (FIB) microscope, dual beam microscopy system, or combinations thereof. FIG. 2 shows the example microscope system(s) 202 as being a TEM microscope system.

FIG. 2 depicts the example microscope system(s) 202 as including an electron source 210 (e.g., a thermal electron source, Schottky-emission source, field emission source, etc.) that emits an electron beam 212 along an electron emission axis 214 and towards the sample 204. The electron emission axis 214 is a central axis that runs along the length of the example microscope system(s) 202 from the electron source 210 and through the sample 204. While FIG. 2 depicts the example microscope system(s) 202 as including an electron source 210, in other embodiments the example microscope system(s) 202 may comprise a charged particle source, such as an ion source, configured to emit a plurality of charged particles toward the sample 204.

An accelerator lens 216 accelerates/decelerates, focuses, and/or directs the electron beam 216 towards an electron focusing column 218. The electron condenser column 218 focuses the electron beam 212 so that it is incident on at least a portion of the sample 204. Additionally, the condenser column 218 may correct and/or tune aberrations (e.g., geometric aberrations, chromatic aberrations) of the electron beam 212. In some embodiments, the electron focusing column 218 may include one or more of an aperture, transfer lenses, scan coils, condenser lenses, deflectors 206, objective lens, etc. that together focus electrons from electron source 210 onto a small spot on the sample 204 (STEM mode), or provide a wider illumination beam on the sample (TEM mode).

FIG. 2 further depicts an inset cross-sectional view 220 of a deflector 206 according to the present invention, configured to provide an electrical field to deflect the beam. Cross-sectional view 220 shows the deflector 206 as comprising an inner core 222 composed of an electrically isolating material. In various embodiments, the inner core 222 may be composed of various electrically resistant materials such as a ceramic material, a vitreous material, quartz, a semiconductor material, etc. A person having skill in the art would understand that this list of potential electrically resistant materials is not exhaustive, and that various electrically isolating materials (and/or combinations thereof) may be selected according to the function of the optical element or the system in which it resides. Deflector 206 is further shown as comprising an outer coating 224 composed of an electrically conductive material that completely encloses the inner core. The electrically conductive material is selected such that the product of the thickness of the outer coating (t) and the electrical conductivity ($\sigma$) of the electrically conductive material is less than 0.01 $\Omega^{-1}$, 0.001 $\Omega^{-1}$, and/or 0.0001 $\Omega^{-1}$. In various embodiments, the outer coating 224 may be electrically grounded, and/or may have a sheet resistance that is greater than 10 k$\Omega$, and/or greater than 100 k$\Omega$. The presence of this outer coating 224 on the deflector 206 causes the amount of thermal magnetic noise (i.e., Johnson noise) that is generated by the deflector 206 to be reduced by at least 2×, 3×, or an order of magnitude over known optical elements.

Different locations of the sample 204 may be scanned by adjusting the electron beam direction via the deflectors 206 and/or scan coils. In this way, the electron beam 212 acts as an imaging beam that is scanned across a surface layer of the sample (i.e., the surface of the layer proximate the microscope column 202 and/or that is irradiated by the electron beam 212). This irradiation of the surface layer of the sample 204 causes the component electrons of the electron beam 212 to interact with component elements/molecules/features of the sample, such that component elements/molecules/ features cause emissions to be emitted by the sample 204. The specific emissions that are released are based on the corresponding elements/molecules/features that caused them to be emitted, such that the emissions can be analyzed to determine information about the corresponding elements/molecules.

FIG. 2 further illustrates a detector system 226 for detecting emissions resultant from the electron beam 212 being incident on the sample 204. The detector system 226 may comprise one or more detectors positioned or otherwise configured to detect such emissions. In various embodiments, different detectors and/or different portions of single detectors may be configured to detect different types of emissions, or be configured such that different parameters of the emissions detected by the different detectors and/or different portions.

FIG. 2 further includes an inset cross-sectional view 230 of a corrector system 208 according to the present invention. The corrector system 208 comprises a plurality of outer magnetic elements 232 (e.g., a magnetic multipole comprising 8 or 12 poles) and a plurality of electrodes 234 (e.g., an electrostatic multipole), where the electrodes 234 are positioned more proximate to the charged particle beam 212 than the outer magnetic elements 232.

Cross-sectional view 230 shows the electrodes 234 as comprising an inner core composed of an electrically isolating material (e.g., a ceramic material, a vitreous material, quartz, a semiconductor material, etc.) and an outer coating composed of an electrically conductive material that completely encloses the inner core. The electrically conductive material is selected such that the product of the thickness of the outer coating (t) and the electrical conductivity ($\sigma$) of the electrically conductive material is less than 0.01 $\Omega^{-1}$, 0.001 $\Omega^{-1}$, and/or 0.0001 $\Omega^{-1}$. In various embodiments, the outer coating may be electrically grounded, and/or may have a sheet resistance that is greater than 10 k$\Omega$, and/or greater than 100 k$\Omega$. The presence of this outer coating 224 on the electrodes 234 causes the amount of thermal magnetic noise (i.e., Johnson noise) that is generated by the corrector system 208 to be reduced by at least 2×, 3×, or an order of magnitude over known optical elements. FIG. 2 further shows the corrector system 208 as optionally including a barrier between the magnetic elements 232 and the electrodes 234. For example, the barrier 236 may partially define a vacuum region through which the charged particle beam 212 travels.

FIG. 2 further illustrates the example microscope system(s) 202 as further including a sample holder 228. The sample holder 228 is configured to hold the sample 204, and can translate, rotate, and/or tilt the sample 204 in relation to the example microscope system(s) 202.

The environment 200 is also shown as including one or more computing device(s) 238 connected to the detector system 226. The detector system 226 is further configured to generate a data/data signal corresponding to the detected emissions, and transmit the data/data signal to one or more computing devices 238. Those skilled in the art will appreciate that the computing devices 238 depicted in FIG. 2 are merely illustrative and are not intended to limit the scope of the present disclosure. The computing system and devices may include any combination of hardware or software that can perform the indicated functions, including computers, network devices, internet appliances, PDAs, wireless phones, controllers, oscilloscopes, amplifiers, etc. The computing devices 238 may also be connected to other devices that are not illustrated, or instead may operate as a stand-alone system.

It is also noted that one or more of the computing device(s) 238 may be a component of the example microscope system(s) 202, may be a separate device from the example microscope system(s) 202 which is in communication with the example microscope system(s) 202 via a network communication interface, or a combination thereof. For example, an example microscope system(s) 202 may include a first computing device 238 that is a component portion of the example microscope system(s) 202, and which acts as a controller that drives the operation of the example charged particle microscope system(s) 202 (e.g., adjust the scanning location on the sample by operating the scan coils, etc.). In such an embodiment the example microscope system(s) 202 may also include a second computing device 238 that is desktop computer separate from the example microscope system(s) 202, and which is executable to process data received from the detector system 226 to generate images of the sample 204 and/or perform other types of analysis or post processing of detector data. The computing devices 238 may further be configured to receive user selections via a keyboard, mouse, touchpad, touchscreen, etc.

Figure 3:
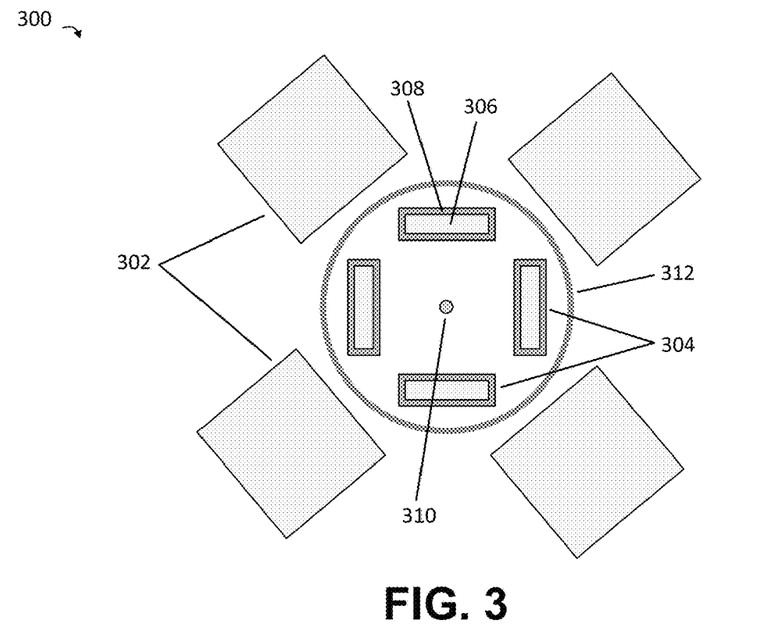
FIGS. 3 and 4 shows a schematic diagram example corrector systems configured according to the present invention to generate reduced thermal magnetic noise during use in charged particle microscope systems
Figure 4:
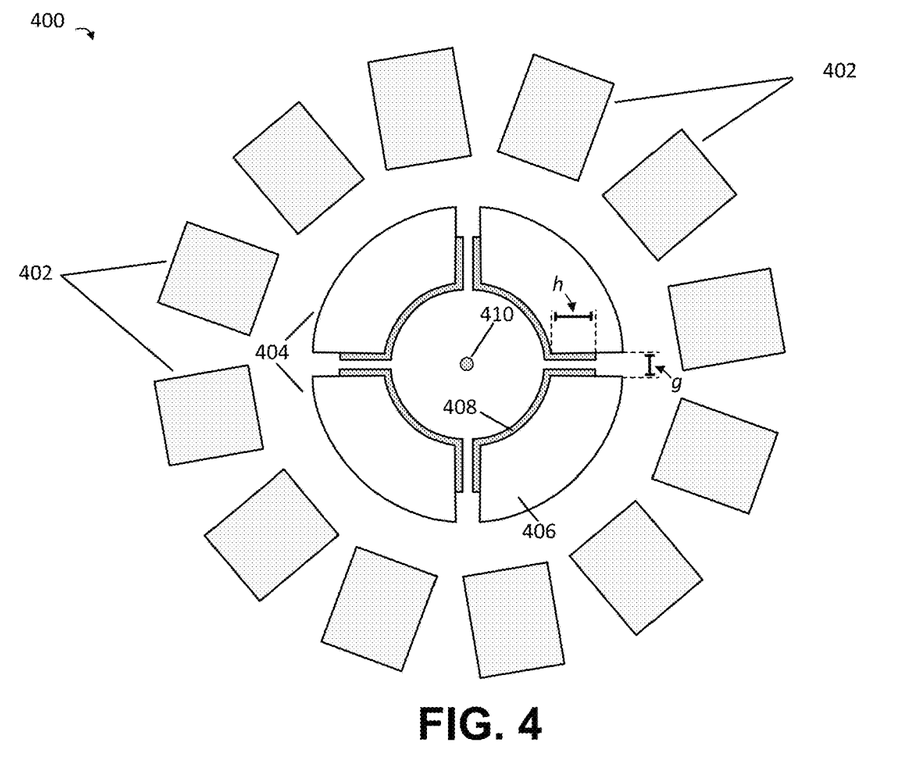

FIGS. 3 and 4 are schematic illustrations of example corrector systems configured according to the present invention to generate reduced thermal magnetic noise during use in charged particle microscope systems. For example, FIG. 3 illustrates an example Cc correcting element of a $C_S/C_C$ corrector system 300 according to the present invention. Specifically, FIG. 3 shows the example $C_S/C_C$ corrector system 300 as comprising a magnetic multipole 302 surrounding an electrostatic quadrupole formed by a plurality of electrodes 304.

FIG. 3 depicts cross sectional views of the electrodes 304 that illustrate that the electrodes 304 are individually formed of a an inner core 306 composed of an electrically isolating material (e.g., a ceramic material, a vitreous material, quartz, a semiconductor material, etc.) and an outer coating 308 composed of an electrically conductive material that completely encloses the inner core. The electrically conductive material is selected such that the product of the thickness of the outer coating (t) and the electrical conductivity ($\sigma$) of the electrically conductive material is less than 0.01 $\Omega^{-1}$, 0.001 $\Omega^{-1}$, and/or 0.0001 $\Omega^{-1}$. In various embodiments, the outer coating 308 may be electrically grounded, and/or may have a sheet resistance that is greater than 10 k$\Omega$, and/or greater than 100 k$\Omega$. The presence of this outer coating 308 on the electrodes 302 causes the amount of thermal magnetic noise (i.e., Johnson noise) that is generated by the example $C_S/C_C$ corrector system 300 to be reduced by at least 2×, 3×, or an order of magnitude over known optical elements when a charged particle beam 310 travels proximate to the electrodes 302. FIG. 3 also illustrates example $C_S/C_C$ corrector system 300 as including an optional barrier 312 that partially defines a vacuum region through which the charged particle beam 310 travels during operation of the example $C_S/C_C$ corrector system 300. However, in other embodiments such an optional barrier 312 may be positioned such that the magnetic multipole is enclosed within the vacuum region.

FIG. 4 illustrates an example Cc correcting element of a $C_S/C_C$ corrector system 400 according to the present invention. Specifically, FIG. 4 shows the example $C_S/C_C$ corrector system 400 as comprising a magnetic multipole 402 surrounding an electrostatic quadrupole formed by a plurality of electrodes 404. FIG. 4 depicts cross sectional views of the electrodes 404 that illustrate that the electrodes 404 are individually formed of an inner core 406 composed of an electrically isolating material (e.g., a ceramic material, a vitreous material, quartz, a semiconductor material, etc.) and an outer coating 408 composed of an electrically conductive material that completely encloses the inner core. FIG. 4 depicts an embodiment where the outer core 408 does not completely enclose the inner core 406. For example, the ratio of h:g may be greater than 5 or 6 in a particular embodiment. The electrically conductive material is selected such that the product of the thickness of the outer coating (t) and the electrical conductivity ($\sigma$) of the electrically conductive material is less than 0.01 $\Omega^{-1}$, 0.001 $\Omega^{-1}$, and/or 0.0001 $\Omega^{-1}$. In various embodiments, the outer coating 408 may be electrically grounded, and/or may have a sheet resistance that is greater than 10 k$\Omega$, and/or greater than 100 k$\Omega$. The presence of this outer coating 408 on the electrodes 402 causes the amount of thermal magnetic noise (i.e., Johnson noise) that is generated by the example $C_S/C_C$ corrector system 400 to be reduced by at least 2×, 3×, or an order of magnitude over known optical elements when a charged particle beam 410 travels proximate to the electrodes 402.

Figure 5:
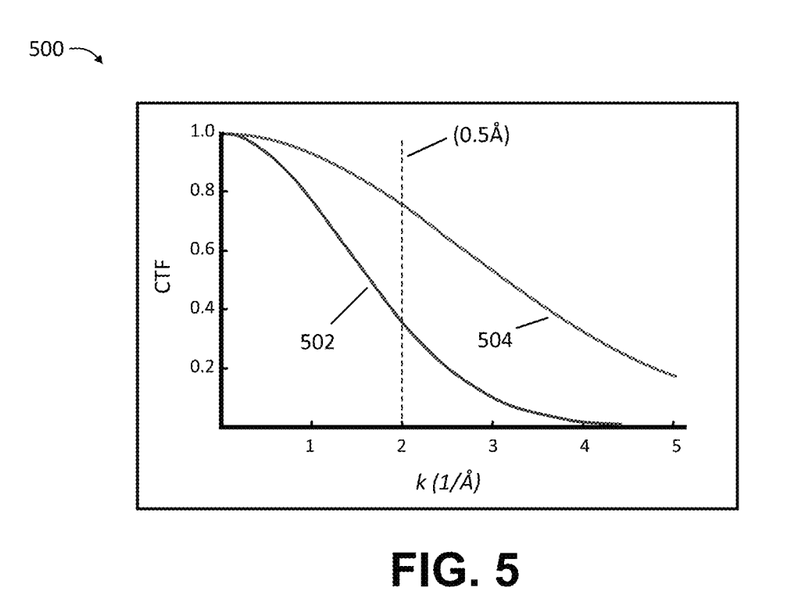
FIG. 5 shows an example graph that illustrates the contribution of Thermal magnetic noise (Johnson noise) to the optical transfer function for various system configurations, according to the present invention Like reference numerals refer to corresponding parts throughout the several views of the drawings. Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

FIG. 5 illustrates graphical relationships of the contributions of thermal magnetic field noise (Johnson noise) to the TEM contrast transfer function (CTF) for both an existing system using present technology and a system incorporating technology from the present disclosure. Specifically, FIG. 5 shows a graph that illustrates the contributions of Johnson noise to the CTF for example $C_C/C_S$ corrector systems which comprise two quadrupole Wien filters as $C_C$ correcting elements. These two elements correct for the axial chromatic aberration $C_C$ of all other lenses, with a major contribution of the objective lens. Curve 502 corresponds to the contribution of Johnson noise to the CTF for a first version of such an example $C_C/C_S$ corrector system that is constructed according to prior technology. Curve 504 corresponds to the contribution of Johnson noise to the CTF for a second version of the example $C_C/C_S$ corrector system that was constructed to incorporate technology from the present disclosure.

When evaluating the contribution of thermal magnetic field noise to the TEM CTF for these two example $C_C/C_S$ corrector systems, we consider the common and ideal case where there are two mutually perpendicular line foci of equal length in the centers of these quadrupole Wien filters. We further consider an axial electron (i.e., an electron whose path starts on the optical axis in the specimen plane) with half opening angle $\alpha_x$ in the specimen plane, which has a lateral position x at the center of one quadrupole Wien filter (and hence x=0 in the other one). An effective focal distance $f_{eff}$ can then be defined as $f_{eff}=x/\alpha_x$. The Johnson noise generated by the two quadrupole Wien filters cause a Gaussian image spread in the specimen plane, with an rms value $\sigma$ given by:

$$\sigma^2 = \frac{C_J C_{metal} L f_{eff}^2}{U_r R^2}, \quad (1)$$

in which $U_r$=relativistic electron voltage=$U+eU^2/(2mc^2)$, and L and R=length and inner radius of the quadrupole Wien filters. Furthermore, the constant $C_j$ is defined as:

$$C_J = \frac{3}{4}\pi\eta^2\mu_0 k_B T, \quad (2),$$

which is equal to $1.05\times10^{-15}$ (in SI units) when the system is at room temperature; $k_B$ is the Boltzmann constant. Additionally, the dimensionless constant $C_{metal} \approx 0.085 \equiv C_{non-magn}$ for non-magnetic metals, and it equals approximately $0.17 \equiv C_{magn}$ for soft-magnetic iron.

Curve 502 in FIG. 5 describes the contribution of thermal magnetic field noise from a $C_C/C_S$ corrector system having two $C_C$ correcting elements which are magnetic multipoles with quadrupole voltages between $V_q$ and $-V_q$ on its yokes. This allows equation (2) to be evaluated as:

$$\sigma^2 = 2C_J C_{magn} C_c \gamma V_q^{-1} \quad (3),$$

in which $\gamma=1+eU/(mc^2)$, which expresses the image spread caused by thermal magnetic field noise in terms of the parameters of the quadrupole Wien filter. It may appear remarkable to a person skilled in the art that the geometric parameters L and R of this element do not appear in equation 3 (as these dimensions affect the Johnson noise contributions). However, it is noted that they are absent because the effect of the L and R parameters on the magnification between the corrector system and the objective lens (i.e., they affect $f_{eff}$ which is needed for chromatic aberration correction) causes these parameters drop out of equation 3. In a quadrupole Wien filter according to the invention, the magnetic multipole can have a larger radius R, leading to less Johnson noise. In terms of the parameters of this magnetic multipole, the Johnson noise rms value $\sigma$ is given by:

$$\sigma^2 = \frac{2C_J C_{magn} C_c \gamma^2}{\eta U_r^{1/2} R B_{yoke}}, \quad (4)$$

in which $\eta=\sqrt{e/(2m)}$, and $B_{yoke}$ is the maximum magnetic field at the inner radius R of the magnetic multipole. Equation 4 is used to calculate curve 504. The contribution of Johnson noise to the TEM Contrast Transfer Function (CTF) is given by:

$$CTF(Johnson)=e^{[-2(\pi\sigma k)^2]} \quad (5),$$

in which k is the spatial frequency.

In FIG. 5, curve 504 shows the contribution of Johnson noise to the CTF for a $C_C/C_S$ corrector system comprising magnetic and electrostatic quadrupoles, according to the present disclosure. Equations 4 and 5 are used to calculate curve 504, with parameters $C_C$=1.6 mm, U=300 kV, R=6 mm, and $B_{yoke}$=0.04 Tesla. The Johnson noise produced by the inner electrodes is assumed to be negligible.

Curve 502 shows the relationship for a first case where the electrodes of the $C_C$ correcting elements do not individually comprise an inner core composed of an electrically isolating material and an outer coating composed of an electrically conductive material. For practical reasons, the quadrupole voltage $V_q$ is usually chosen to be smaller than 10 kV. Curve 502 is calculated for $C_C$=1.6 mm and $V_q$=6 kV, using equations 3 and 5.

Examples of inventive subject matter according to the present disclosure are described in the following enumerated paragraphs.

A1. A corrector system having reduced Johnson noise generation, the corrector system comprising: an outer magnetic multipole; an inner electrostatic multipole, wherein a component of the inner electrostatic multipole comprises: an inner core composed of an electrically isolating material; and an outer coating composed of an electrically conductive material.

A1.1. The corrector system of paragraph A1, wherein the electrically isolating material comprises a semiconductor material.
A1.2. The corrector system of paragraph A1, wherein the electrically isolating material comprises a ceramic material.
A2. The corrector system of paragraph A1, wherein the outer coating completely encloses the inner core.
A3. The corrector system of any of paragraphs A1-A2.1, wherein the component is an electrode.
A4. The corrector system of any of paragraphs A1-A3, wherein the inner electrostatic multipole comprises a plurality of electrodes.
A4.1. The corrector system of paragraph A4, wherein each of the plurality of electrodes comprises: an inner core composed of an electrically isolating material; and an outer coating composed of an electrically conductive material.
A5. The corrector system of any of paragraphs A1-A4.1, wherein the corrector is a $C_c$ corrector.
A6. The corrector system of any of paragraphs A1-A4.1, wherein the corrector is a $C_c/C_s$ corrector.
A6.1. The corrector system of any of paragraphs A1-A4.1, wherein the corrector is a $C_S$ corrector.
A7. The corrector system of any of paragraphs A1-A6, wherein the outer coating has a sheet resistance of greater than 10 kΩ.
A7.1. The corrector system of paragraphs A7, wherein the outer coating has a sheet resistance of greater than 100 kΩ.
A8. The corrector system of any of paragraphs A1-A7.1, wherein the product of the thickness of the outer coating (t) and the electrical conductivity (σ) is less than 0.01 $Ω^{-1}$.
A8.1. The corrector system of paragraph A8, wherein the product of the thickness of the outer coating (t) and the electrical conductivity (σ) is less than 0.001 $Ω^{-1}$.
A8.2. The corrector system of paragraph A8, wherein the product of the thickness of the outer coating (t) and the electrical conductivity (σ) is less than 0.0001 $Ω^{-1}$.
A9. The corrector system of any of paragraphs A1-A7.1, wherein the outer coating causes a reduction in Johnson noise of 2×, 3×, or an order of magnitude.
A9.1. The corrector system of paragraphs A9, wherein the outer coating causes a reduction in Johnson noise of greater than 2×, 3×, or an order of magnitude.
A10. The corrector system of any of paragraphs A1-A9.1, wherein the outer coating is electrically grounded.
B1. An electron microscopy optical element having reduced Johnson noise generation, the optical element comprising: an inner core composed of an electrically isolating material; an outer coating composed of an electrically conductive material.
B1.1. The optical element of paragraph B1, wherein the electrically isolating material comprises a semiconductor material.
B1.2. The optical element of paragraph B1, wherein the electrically isolating material comprises a ceramic material.
B2. The optical element of paragraph B1, wherein the outer coating completely encloses the inner core.
B3. The optical element of any of paragraphs B1-B2.1, wherein the optical element is an electrode.
B5. The optical element of any of paragraphs B1-B4.1, wherein the optical element is a corrector.
B5.1. The optical element of paragraph B5, wherein the optical element is a $C_c$ corrector.
B5.2. The optical element of any of paragraphs B5-B5.1, wherein the optical element is a $C_c/C_s$ corrector.
B5.3. The optical element of any of paragraphs B5-B5.2, wherein the optical element further comprises at least one outer magnetic multipole.
A5.4. The corrector system of any of paragraphs B1-B5, wherein the corrector is a $C_S$ corrector.
B7. The optical element of any of paragraphs B1-B5.4, wherein the outer coating has a sheet resistance of greater than 10 kΩ.
B7.1. The optical element of paragraphs B7, wherein the outer coating has a sheet resistance of greater than 100 kΩ.
B8. The optical element of any of paragraphs B1-B7.1, wherein the product of the thickness of the outer coating (t) and the electrical conductivity (σ) is less than 0.01Ω−1.
B8.1. The optical element of paragraph B8, wherein the product of the thickness of the outer coating (t) and the electrical conductivity (σ) is less than 0.001 $Ω^{-1}$.
B8.2. The optical element of paragraph B8, wherein the product of the thickness of the outer coating (t) and the electrical conductivity (σ) is less than 0.0001 $Ω^{-1}$.
B9. The optical element of any of paragraphs B1-B7.1, wherein the outer coating causes a reduction in Johnson noise of 2×, 3×, or an order of magnitude.
B10. The optical element of any of paragraphs B1-B9, wherein the outer coating is electrically grounded.
C1. Use of the corrector system of any of paragraphs A1-A10.
D1. Use of the optical element of any of paragraphs B1-B10.
E1. A charged particle microscope system configured to have reduced thermal magnetic noise, the system comprising: a charged particle source configured to emit a charged particle beam towards a sample; a focusing column configured to direct the charged particle beam to the sample; a sample holder configured to hold the sample; a detector system configured to detect emissions and/or charged particles based on the charged particle beam interacting with the sample; and at least one of the corrector systems of any of paragraphs A1-A10 and/or the optical element of any of paragraphs B1-B10.
F1. Use of the charged particle microscope system of paragraph E1.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "determine," "identify," "produce," and "provide" to describe the disclosed methods. These terms are high-level abstractions of the actual operations that are performed. The actual operations that correspond to these terms will vary depending on the particular implementation and are readily discernible by one of ordinary skill in the art.

What is claimed is:

1. A corrector system, the corrector system comprising:
an inner electrostatic multi pole formed by a plurality of electrodes, wherein at least one of the electrodes comprises:
a core composed of an electrically isolating material; and
a coating composed of an electrically conductive material that forms an outer layer of at least a portion of the electrode, wherein the coating is positioned between the core of the electrode and a charged particle beam and held at a non-zero electric potential when the corrector system is used in a charged particle system; and
an outer magnetic multi pole that surrounds the inner electrostatic multi pole.

2. The corrector system of claim 1, wherein the non-zero electric potential is less than 10 kV.

3. The corrector system of claim 1, wherein the non-zero electric potential is between 1 kV to 5 kV.

4. The corrector system of claim 1, wherein the non-zero electric potential is −5 kV.

5. The corrector system of claim 1, wherein the coating causes a reduction in Johnson noise of a factor of 2.

6. The corrector system of claim 1, wherein the coating causes a reduction in Johnson noise of an order of magnitude.

7. The corrector system of claim 1, wherein each electrode of the plurality of electrodes comprises a core composed of the electrically isolating material and a coating composed of the electrically conductive material forming an outer layer of at least a portion of each electrode.

8. The corrector system of claim 1, wherein the electrically isolating material comprises a semiconductor material.

9. The corrector system of claim 1, wherein the electrically isolating material comprises a ceramic material.

10. The corrector system of claim 1, wherein the product of the thickness of the coating (t) and the electrical conductivity ($\sigma$) is less than 0.01 ii'.

11. A corrector system, the corrector system comprising:
an inner electrostatic multi pole formed by a plurality of electrodes, wherein a first electrode of the plurality of electrodes comprises:
a core composed of an electrically isolating material and having (i) an inner side orientable toward a beam path of a charged particle system and (ii) a lateral side adjacent to the inner side and not facing the beam path when the inner side is oriented toward the beam path, the lateral side separated by a distance (g) between a second electrode of the plurality of electrodes; and
a coating composed of an electrically conductive material that forms an outer layer of at least a portion of the first electrode, the portion including the inner side and a length (h) along the lateral side adjacent to the inner side, wherein the coating on the inner side is positioned between the core of the first electrode and a charged particle beam along the beam path when the corrector system is used in the charged particle system; and
an outer magnetic multi pole that surrounds the inner electrostatic multi pole.

12. The corrector system of claim 11, wherein the ratio of the length (h) to the distance (g) is greater than 5.

13. The corrector system of claim 11, wherein the ratio of the length (h) to the distance (g) is greater than 6.

14. The corrector system of claim 11, wherein the second electrode comprises:
a second core composed of the electrically isolating material and having (i) a second inner side orientable toward the beam path and (ii) a second lateral side adjacent to the second inner side and not facing the beam path when the second inner side is oriented toward the beam path, the second lateral side separated by the distance (g) between the lateral side of the first electrode; and
a second coating composed of the electrically conductive material that forms a second outer layer of at least a second portion of the second electrode, the second portion including the second inner side and a length (l) along the second lateral side adjacent to the second inner side, wherein the second coating on the second inner side is positioned between the second core of the second electrode and the charged particle beam along the beam path when the corrector system is used in the charged particle system.

15. The corrector system of claim 14, wherein the ratio of the length (l) to the distance (g) is greater than 5.

16. The corrector system of claim 14, wherein the ratio of the length (l) to the distance (g) is greater than 6.

17. The corrector system of claim 14, wherein the length (h) and the length (l) are the same.

18. The corrector system of claim 11, wherein the coating causes a reduction in Johnson noise of a factor of 2.

19. The corrector system of claim 11, wherein the coating causes a reduction in Johnson noise of an order of magnitude.

20. The corrector system of claim 11, wherein the coating has a sheet resistance of greater than 10 k$\Omega$.

* * * * *